United States Patent
Engl

(10) Patent No.: US 6,683,479 B2
(45) Date of Patent: Jan. 27, 2004

(54) MULTIPHASE COMPARATOR

(75) Inventor: Bernhard Engl, Miesbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/218,986

(22) Filed: Aug. 14, 2002

(65) Prior Publication Data

US 2003/0094986 A1 May 22, 2003

(30) Foreign Application Priority Data

Nov. 20, 2001 (DE) .......................... 101 56 817

(51) Int. Cl.$^7$ .............................. H03F 3/45; G11C 7/00; H03K 5/22
(52) U.S. Cl. .............................. 327/52; 327/57; 327/65; 327/89
(58) Field of Search .............................. 327/52, 57, 65, 327/66, 67, 68, 69, 89

(56) References Cited

U.S. PATENT DOCUMENTS

| | | | | |
|---|---|---|---|---|
| 4,739,198 A | * | 4/1988 | Maruyama | 327/52 |
| 5,748,020 A | * | 5/1998 | Mactaggart et al. | 327/218 |
| 6,525,571 B2 | * | 2/2003 | Green | 326/115 |

FOREIGN PATENT DOCUMENTS

DE  689 05 510  2/1989  .......... H03K/3/288

* cited by examiner

Primary Examiner—Tuan T. Lam
(74) Attorney, Agent, or Firm—Fish & Richardson P.C.

(57) ABSTRACT

A multiphase comparator circuit includes a first differential stage; a first switching arrangement for connecting an output of the first differential stage to an input of a load circuit; and two or more regeneration stages. Each regeneration stage is connected to a load circuit and to the first switching arrangement. A clock-controlled second switching arrangement selectively provides an operating current to the regeneration stages. The first and second switching arrangements have switches that are driven so as to operate the regeneration stages in a manner temporally offset from each other.

12 Claims, 10 Drawing Sheets

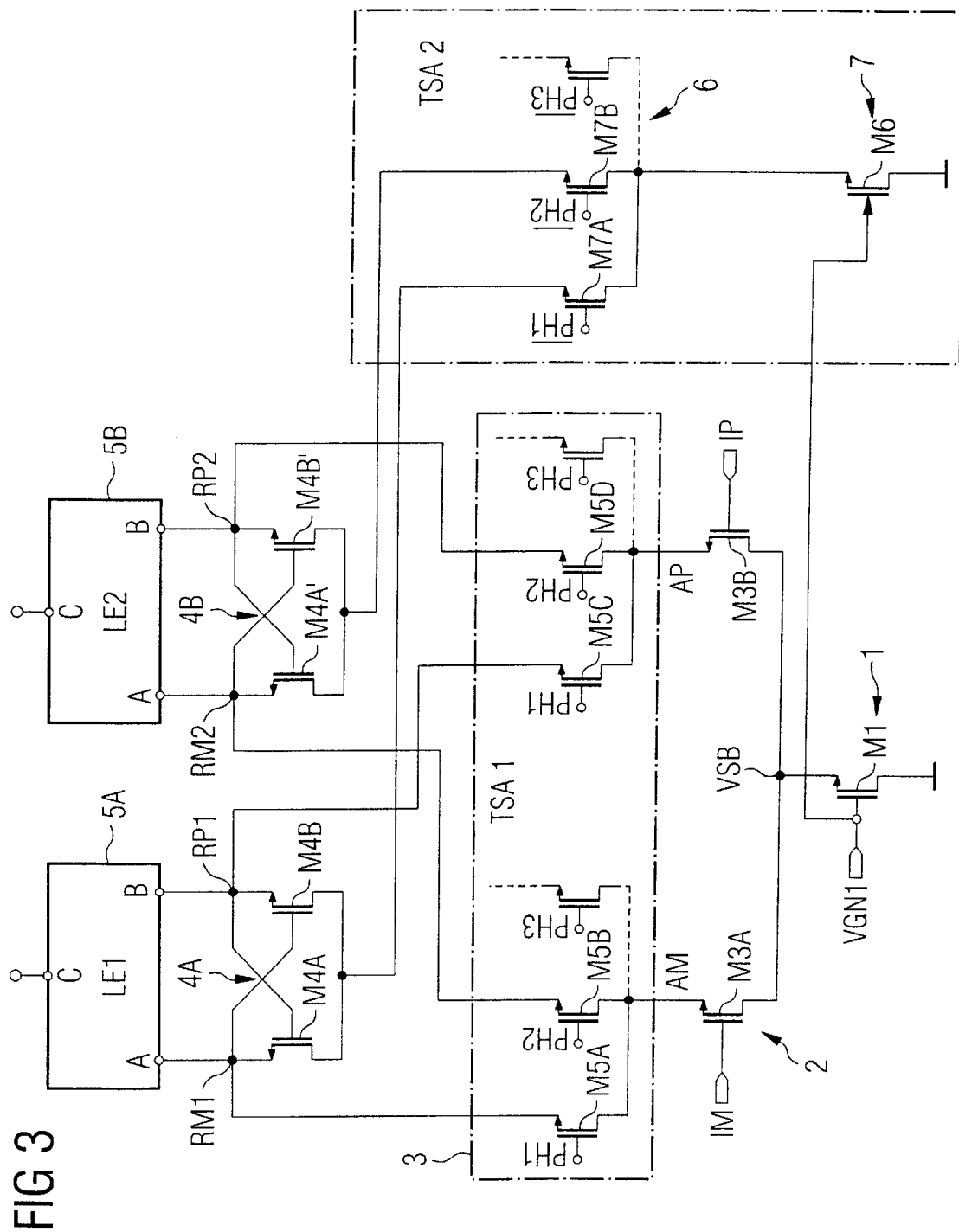

MULTIPHASE COMPARATOR

FIELD OF INVENTION

The invention relates to a multiphase comparator circuit.

RELATED APPLICATIONS

This application claims the benefit of the Nov. 20, 2001 priority date of German application 101 56 817.7, the contents of which are herein incorporated by reference.

BACKGROUND

A typical comparator topology of a known comparator is illustrated in FIG. 1. This comparator comprises a current source M1, which is alternately connected in each case to one of two differential stages 2, 4 via a switching arrangement M2A, M2B. The first differential stage 2 comprises the transistors M3A, M3B and serves for amplifying a differential signal present at the signal inputs IM, IP in a first clock phase. The amplified differential signal present at the nodes A, B is finally amplified further in a second clock phase by means of the second differential stage 4, which comprises the transistors M4A, M4B.

The clock phases are prescribed by the switching arrangement 3 with the transistors M2A, M2B. The clock signals are CLK=1, CLKB=0 in the first clock phase and CLK=0, CLKB=1 in the second clock phase.

The first clock phase is often referred to as "sampling phase" in the literature, and the second clock phase as "regeneration phase." Accordingly, the second differential stage is often also referred to as regeneration stage.

At their output A, B, the differential stages 2, 4 are connected to a common load element 5. The load element 5 may comprise two resistors, for example, as is shown in FIG. 1a. In the case of the present CMOS realization of a comparator, it is possible to provide the load element 5 with PMOS transistors which operate in the triode region, as is illustrated in FIG. 1. In this case, a suitable potential for setting this operating point is fed to the gate terminals of the PMOS transistors.

In FIG. 1c, the load element 5 comprises cross-coupled PMOS transistors. Further variants, such as e.g. a parallel circuit of FIG. 1a and FIG. 1b, are likewise conceivable as load element 5.

The disadvantage of this comparator topology is that, at relatively high clock frequencies, in particular a number of GHz, the bit error rate rises greatly because the time for the regeneration process, in which the regeneration stage amplifies further the small differential signal present between the nodes A and B, becomes ever shorter as the frequency rises. Even with optimized dimensioning of the switching elements, a fundamental speed limit results from the regeneration time constant $\tau$ $$\tau \sim \frac{C}{g_m}$$

where C is the capacitance at one of the nodes A, B of the comparator and $g_m$ is the transconductance of the transistors M4A, M4B of the regeneration stage 4.

The regeneration time constant $\tau$ as such can be understood as a technological constant of a given semiconductor fabrication process. Although the minimum regeneration time constant can be achieved by optimum circuitry measures for a given fabrication process, it cannot be improved further and thus represents a fundamental limit for the operating speed of the comparator according to FIG. 1.

In the regeneration phase, the voltage difference $V_{ab}$ at the nodes A, B of the comparator increases in accordance with the law $$V_{ab} \sim V_{beg} \cdot e^{\left(\frac{t_{reg}}{\tau}\right)}$$

where $V_{beg}$ is the voltage difference—originating from the amplification phase—at the nodes A, B at the beginning of the regeneration phase, and $t_{reg}$ is the duration of the regeneration phase.

A digital switching stage is usually arranged downstream of the comparator of FIG. 1. A bit error occurs when, after the regeneration phase has elapsed, $V_{ab}$ has not grown large enough to reliably change over the digital switching stage connected downstream. The latter is usually an RS flip-flop which requires set/reset pulses of sufficiently large amplitude and duration at its inputs, since otherwise it does not change over or assumes a metastable state. In both cases, an incorrect decision and thus a bit error can result.

These bit errors can be avoided, in principle, only by choosing the regeneration time $t_{reg}$ to be significantly greater than the regeneration time constant $\tau$, in practice usually by a factor of 10–15, and even higher in particularly demanding systems. Consequently, for a given bit error rate and a given semiconductor fabrication process, a specific clock rate of the comparator cannot be exceeded since it is limited by the choice $t_{reg} > 10 \ldots 15\,\tau$.

Many contemporary communications systems encounter this technologically imposed limit with data rates in the gigabit/sec range and require comparators which can operate with a very low bit error rate even at clock frequencies in the GHz range. With the known comparator circuit according to FIG. 1, even in the case of contemporary CMOS processes with a channel length of 100 nm, the required clock rates of e.g. 4 GHz are regularly not attained, or only with a usually unacceptably high bit error rate.

A possible comparator for input signals with clock rates of a number of GHz is illustrated in FIG. 2. In this case, here two—it can also be more—comparators from FIG. 1 are operated in parallel, with inverted clocks CLK, CLKB in each case, so that a doubled, n-fold in the case of n comparators, effective comparison rate results for the same clock rate of the clock CLK.

This embodiment of a multiple comparator is entirely functional, but a number of problems arise. A first problem is that the duplication of the first differential stage 2 means that the capacitive loading on the input nodes IM, IP is also doubled. As a result of this, the current must be more than doubled in a preceding stage in order still to achieve the same signal bandwidth. In practice, this usually leads to an unacceptable power consumption.

A second problem is that a clock-frequency tone arises in the spectrum of the sampled signal as a result of the in practice always different offset voltages of the doubled first differential stages 2, 2' with the transistors M3A, M3B and M3A', M3B'. Particularly when such a comparator is used in a fast A/D converter, e.g. a flash ADC, the so-called SFDR ("Spurious Free Dynamic Range") of the ADC is thereby impaired.

SUMMARY

Therefore, the object of the present invention is to provide a comparator with a significantly higher comparison rate whilst avoiding the disadvantages mentioned above.

The essential concept of the invention consists in providing the comparator with a plurality of regeneration stages which are connected in parallel and are driven by a first and a second switching arrangement, the parallel regeneration stages being driven in such a way that they operate in a temporally offset manner.

Such a multiphase comparator circuit thus comprises a first differential stage, to which the signal inputs are fed, a first switching arrangement, which can optionally connect the output of the first differential stage to the input of a plurality of load circuits, at least two regeneration stages, which are each connected to one of the load circuits and the first switching arrangement, and a clock-controlled, second switching arrangement, in order to feed a connectable and disconnectable operating current to the at least two regeneration stages, the switches of the first and second switching arrangements being driven in such a way that the regeneration stages operate in a temporally offset manner.

In accordance with a preferred embodiment of the invention, a current source for supplying the comparator is provided, which is connected to a common reference node of the first differential stage.

The first or second switching arrangement preferably comprises a plurality of transistors acting as clock-controlled switches, which transistors are preferably fed by a second current source.

In one embodiment of the comparator circuit with two regeneration stages, the first and second switching arrangements are preferably clocked with two clock phases generated from a single clock signal. The two clock phases are preferably produced from the clock signal and the inverse thereof.

In accordance with a preferred embodiment of the invention, the switches of the first or second switching arrangement are formed as MOS transistors, in particular as NMOS transistors.

In one embodiment of the comparator circuit with two regeneration stages, the switches of the first and second switching arrangements are preferably clocked with at least two clock phases which do not overlap, so that the output of the first differential stage is only ever connected to one load element.

In one embodiment of the comparator with three or more regeneration stages, the switches of the first and second switching arrangements are preferably clocked with three or more clock phases which overlap, so that the output of the first differential stage is occasionally connected simultaneously to two or more load elements.

The output signals of the regeneration stages are preferably passed via a gating circuit to a common storage cell, such as e.g. an RS flip-flop, so that, at the output thereof, a comparator result is present with an effective comparison rate which is calculated from the sum of the comparison rates of the individual differential and regeneration stages.

In order to achieve even higher effective comparison rates, the output signals of the regeneration stages are preferably combined in groups via the gating circuit and passed to a plurality of storage cells, at the output thereof the comparison result being present with a speed corresponding to a fraction of the effective comparison rate.

The gating circuit preferably has a stabilization circuit in order to stabilize a level, in particular a low level of a signal which has been conditioned in the gating circuit and is fed to the storage cell.

The gating circuit preferably comprises a plurality of transistors whose control inputs are connected to the outputs of the regeneration stages.

In the case of particularly stringent requirements made of the comparison rate, it is also possible to provide a dedicated storage element for each regeneration stage.

BRIEF DESCRIPTION OF THE FIGURES

The invention is explained in more detail below by way of example with reference to the accompanying drawings, in which:

FIG. 3 shows a preferred embodiment of a multiphase comparator in accordance with an exemplary embodiment of the invention;

DETAILED DESCRIPTION

Figure 1A:
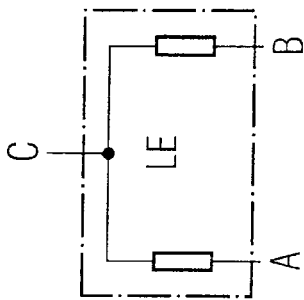
FIGS. 1a, 1b, 1c show exemplary embodiments of a load element.
Figure 1B:
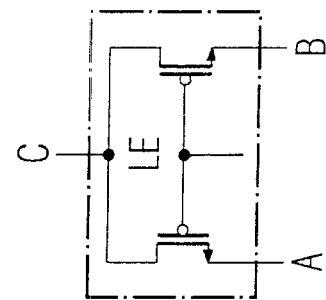
Figure 1C:
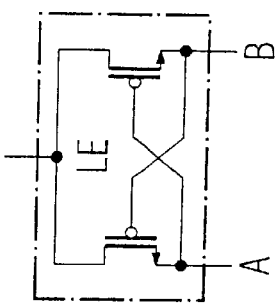
Figure 1:
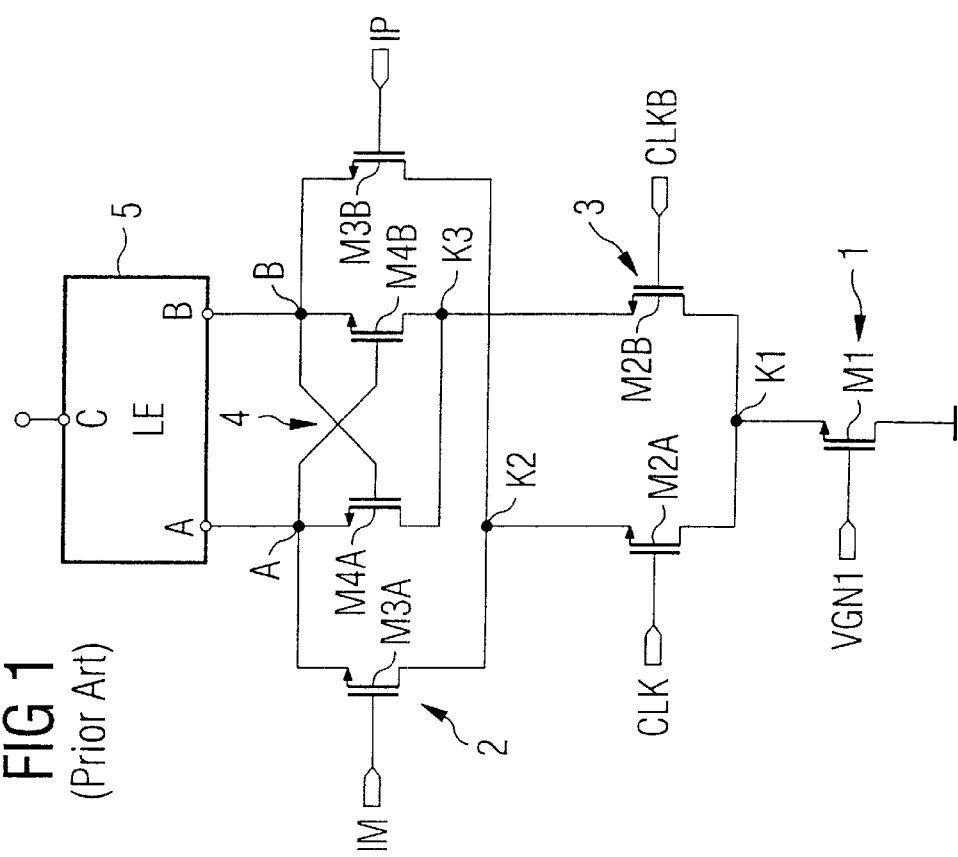
FIG. 1 shows a comparator in accordance with the prior art.
Figure 2:
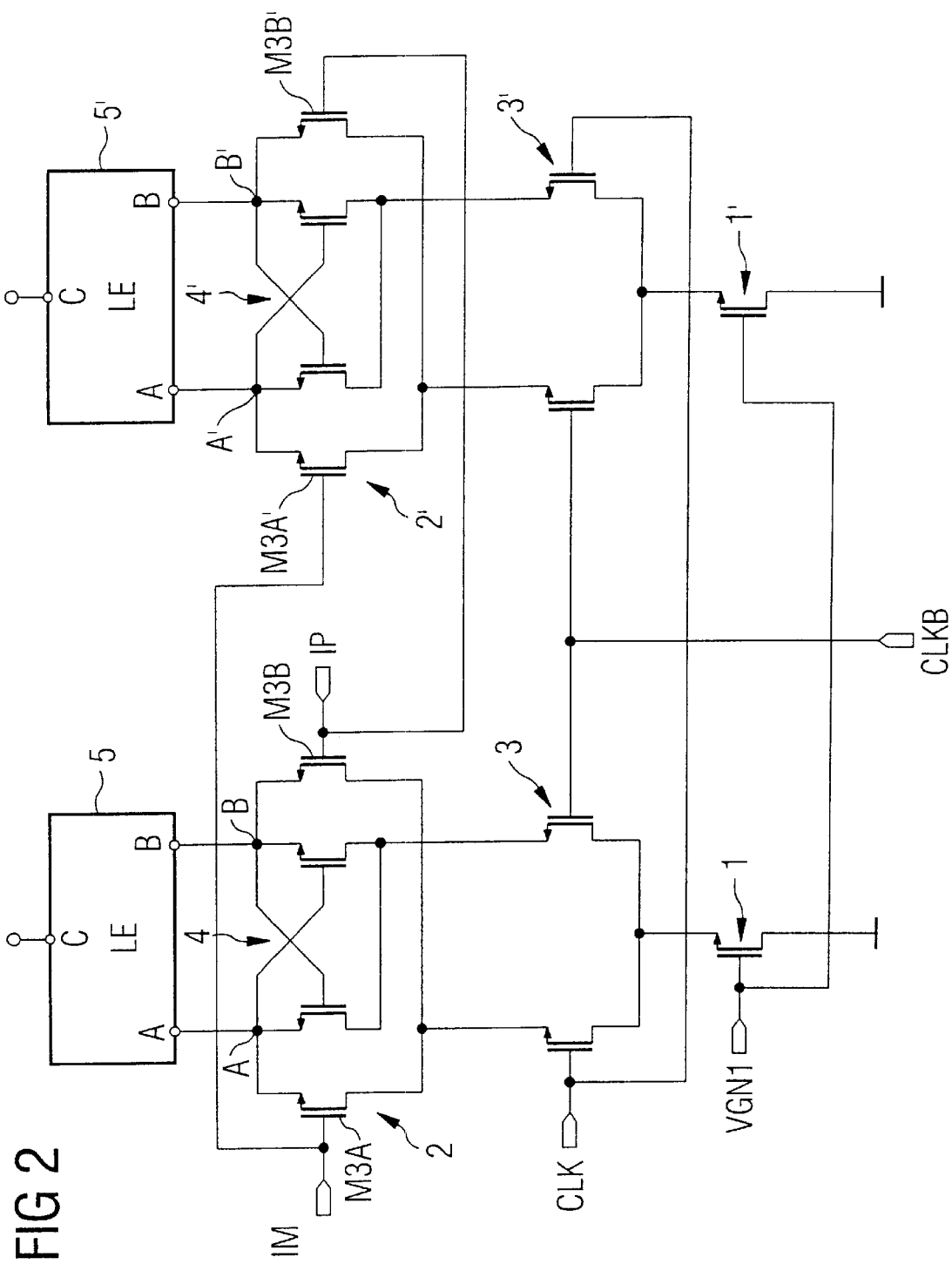
FIG. 2 shows a possible embodiment of a multiphase comparator.

FIG. 3 shows a preferred embodiment of a multiphase comparator having a first differential stage 2 (input differential stage) and a plurality of cross-coupled differential stages 4A, 4B (regeneration stages). The differential stage 2 is supplied by a current source M1, which is connected to a common reference node VSB of the input differential stage 2. In this embodiment, the signal inputs IM, IP are passed to the input differential stage 2. In the present case, the input signals IM, IP are present at the control inputs of two NMOS transistors M3A, M3B.

The current source 1, which is illustrated diagrammatically here as an NMOS transistor, is operated with a gate voltage VGN1 which sets its operating point.

The multiphase comparator furthermore comprises a first switching arrangement 3 with a plurality of transistors M5A–M5D acting as clock-controlled switches, which transistors can optionally connect the output node pair AM, AP of the input differential stage 2 to input nodes RP1, RM1 and RP2, RM2 of two load circuits 5A, 5B.

The regeneration stages 4A, 4B are connected, on the one hand, to in each case two switches M5A, M5C and M5B, M5D, respectively, of the first switching arrangement 3 and, on the other hand, in each case to an associated load circuit 5A, 5B (nodes RM1, RP1 and RM2, RP2).

The two cross-coupled differential stages 4A, 4B in each case comprise two NMOS transistors M4A, M4B and M4A', M4B', respectively. The two cross-coupled differential stages are fed by a current source 7, a second switching arrangement being provided between the current source 7 and the regeneration stages 4A, 4B, which switching arrangement can connect and disconnect the operating current for the regeneration stages 4A, 4B.

The second switching arrangement 6 comprises a separate transistor M7A, M7B, acting as a switch, for each regeneration stage 4A, 4B.

In order to explain the function of this comparator, reference is made to FIG. 5 below.

Figure 5:
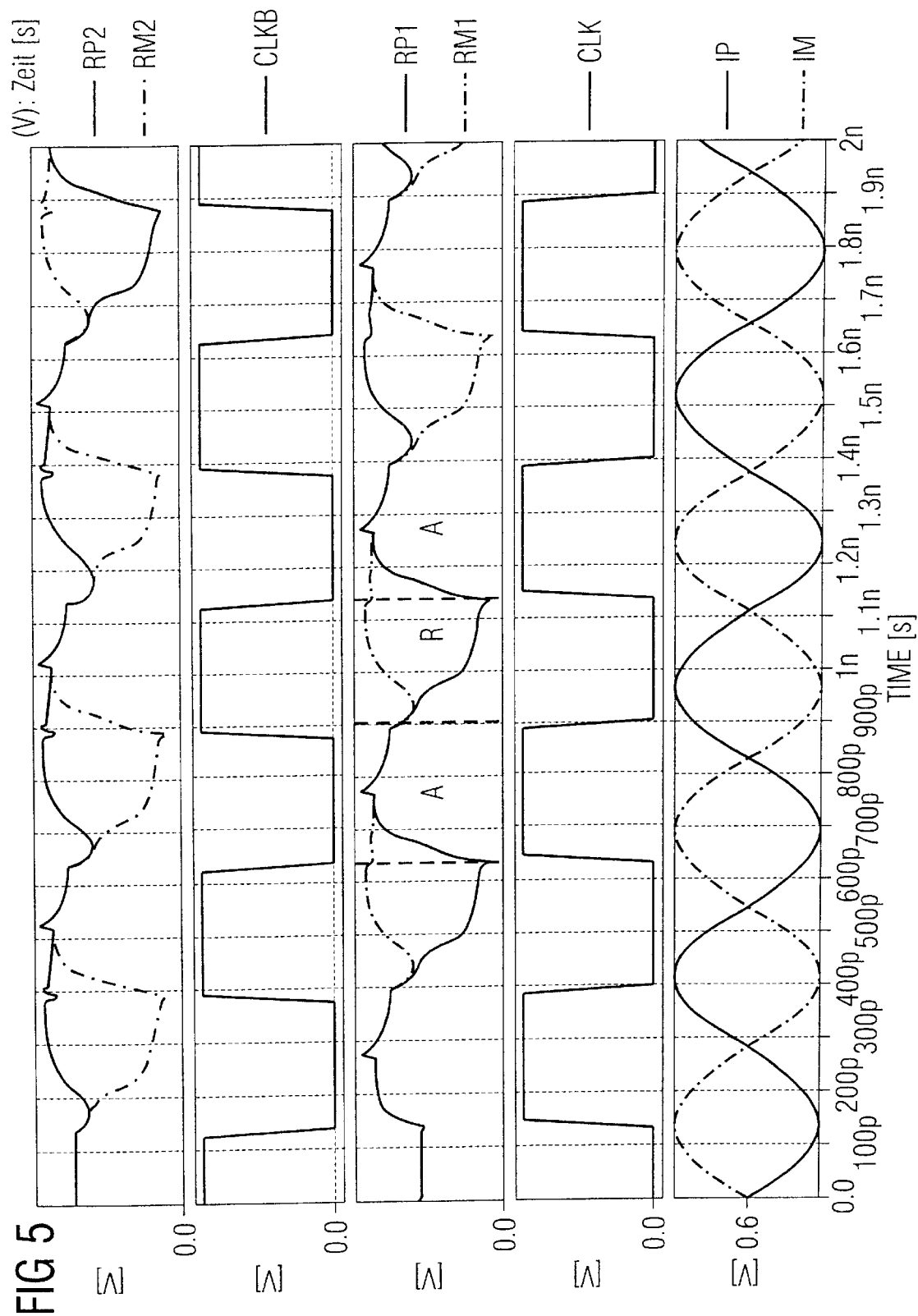
FIG. 5 shows signal profiles at nodes of the comparator of FIG. 3.

FIG. 5 shows, in the center, the profile of the signals at the nodes RP1, RM1 for two-phase operation. A distinction is essentially made between two clock phases, which are referred to as "sampling phase" A and "regeneration phase" R. In the sampling phase A, the differential signal present at the inputs IM, IP is firstly passed to the nodes RM1, RP1. In this case, the switches M5A, M5C of the first switching arrangement 3 are switched in a low-impedance manner, the following holding true: PH1=CLK=1.

At the beginning of the regeneration phase R, a relatively small signal is thus present at the nodes RM1, RP1 (this is not discernible at all in the signal profile on account of a small amplitude), which signal is finally amplified in the regeneration phase R by the cross-coupled differential stage 4A, as can be discerned in FIG. 5. In this case, the following holds true: PH1=CLK=0 and /PH1=CLKB=1.

The clocks which switch the clock-controlled switches M5A, M5D and M7A, M7B of the first and second switching arrangements 3 and 6, respectively, are designated by PH1, PH2, PH3, /PH1, /PH2, /PH3 in FIG. 3. A clock phase CLK and the complement CLKB thereof suffice for the illustrated double design of the regeneration stages 4A, 4B and load circuits 5A, 5B. The third clock phase PH3 and /PH3 has been depicted in order to indicate how the principle according to the invention can be extended to an arbitrary number of load elements 5A, 5B and cross-coupled differential stages 4A, 4B by providing correspondingly more switching transistors.

In this case, the clock phases PHx can assume arbitrary phase angles with respect to one another and be nonoverlapping or overlapping. In the case of at least three overlapping clock phases, the result, in an advantageous manner, is a connection of the amplified input signal from the nodes AN, AP simultaneously to a plurality of load elements 5A, 5B, this resulting in an interpolation which reduces tones in the spectrum as a result of deviations among the load elements 5A, 5B.

If the multiphase comparator illustrated is of only two-phase design, a single clock signal CLK and its complement CLKB suffice for forming the two clock phases PH1, PH2 required. In this case, the following relationships then hold true: PH1=CLK, PH2=CLKB, /PH1=CLKB, /PH2=CLK.

The clocks CLK and CLKB are likewise illustrated in FIG. 5, where it can be discerned that their profiles run in exactly opposite directions.

The topmost graph of FIG. 5 shows the temporal profile of the signals at the nodes RP2, RM2 for this two-phase case. If the clock signal designated by CLK=PH1 is high, the output node pair AN, AP of the input differential stage 2 is connected to the nodes RM1, RP1 of the load circuit 5A via the transistors M5A, M5C acting as switches. The amplified input signal IM, IP is therefore passed to the nodes RM1, RP1. In the graph, the signal has an amplitude too small to be discernible.

If the clock signal designated by CLK=PH1 then becomes low, the transistors M5A, M5C acting as switches turn off. At the same time, the inverse clock signal CLKB becomes high and the cross-coupled differential stage M4A, M4B receives an operating current from the current source M6 via the transistor M7A, which is switched on by the signal CLKB=/PH1, the regeneration operation beginning. In the graph, the latter can be seen from the fact that the voltages at the nodes RP1, RM1 diverge and reach virtually full logic levels within the regeneration time.

While the regeneration operation now takes place given CLK=PH1=0=low at the nodes RM1, RP1, the output nodes AM, AP of the input differential stage 2 are connected to the node pair RM2, RP2 of the second load circuit 5B via the transistors M5B, M5D acting as switches. The amplified input signal IM, IP is thus present there.

If the clock signal designated by CLK=PH1 then becomes high again, the amplified input signal is passed via the switches M5A, M5C to the node pair RM1, RP1 again. Via the transistor M7B, which is switched on by CLK=/PH2, the operating current originating from the current source M6 is then fed to the cross-coupled differential stage M4A', M4B', and the regeneration process then takes place at the nodes RM2, RP2.

In the comparator circuit proposed, the sampling (amplification) phase and the regeneration phase are thus distributed between at least two regeneration stages 4A, 4B and load elements 5A, 5B as a result of which the effective comparison rate can be correspondingly increased.

By using a multiphase clock system and correspondingly multiplied switches M5x and load circuits 5x and regeneration stages 4x, it is possible to multiply the time period for the amplification or regeneration phase in accordance with the number of clock phases.

Multiplication of the capacitance at the input nodes IP, IM does not occur, since the input differential stage 2 itself is not multiplied. Since, given proper dimensioning of the circuit, the greatest proportion of the effective offset voltage is essentially determined by the difference between the threshold voltages of the input differential stage, the distribution does not result in harmful tones in the spectrum, or they are small enough to be negligible.

Figure 4A:
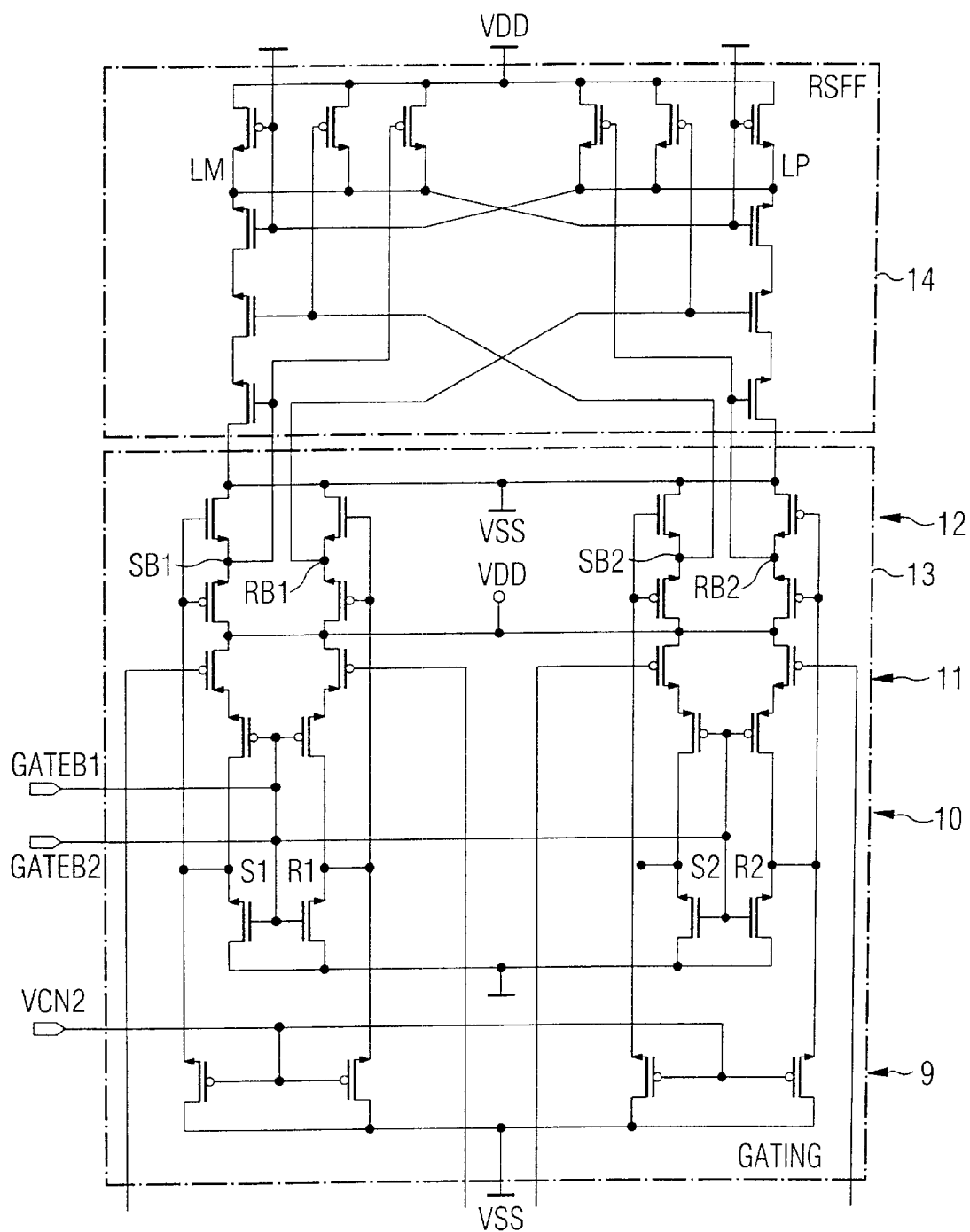
FIGS. 4A–B show exemplary embodiments of a concrete topology for a multiphase comparator according to the invention.
Figure 4B:
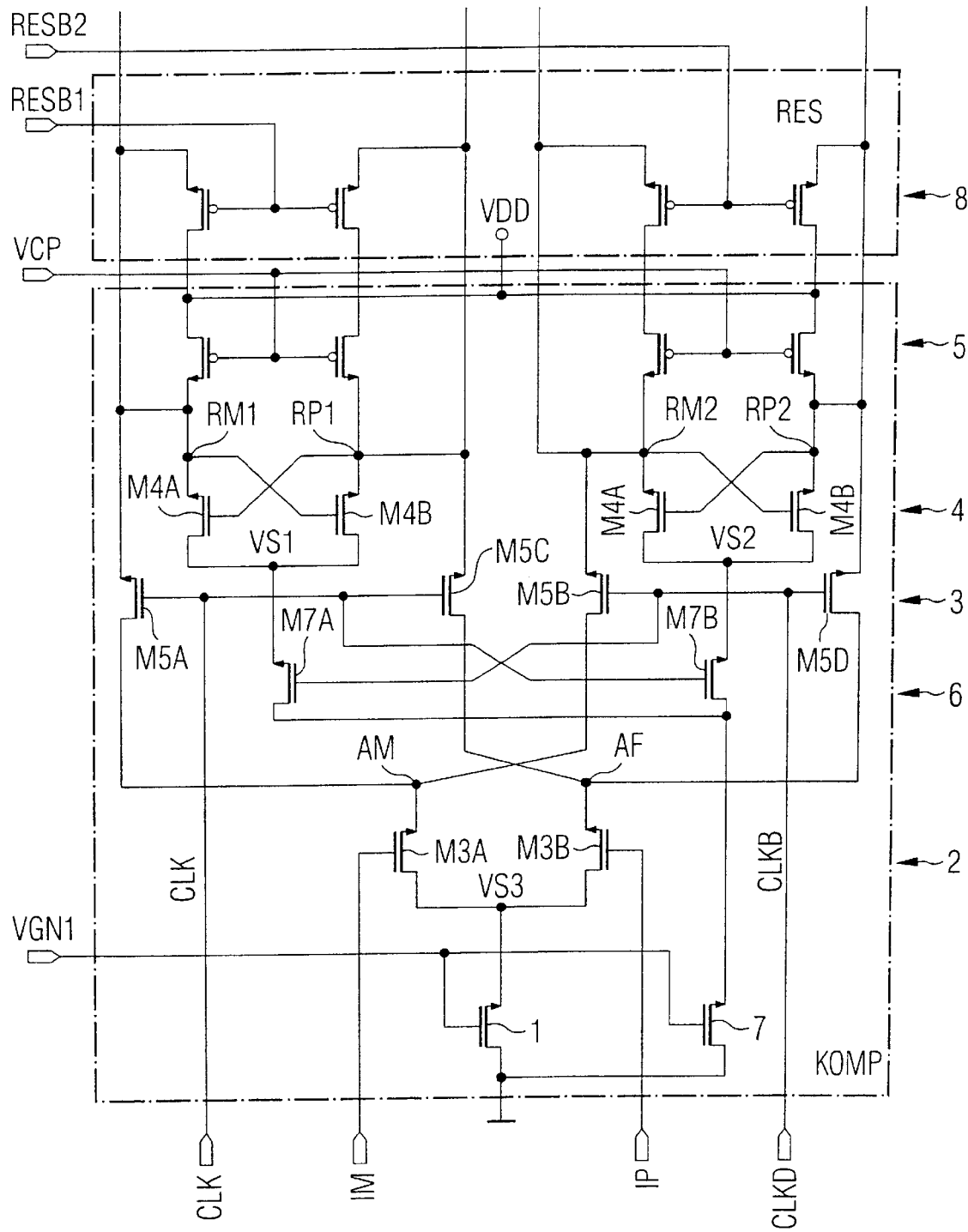

FIG. 4 shows a practical embodiment of the invention, in which the multiphase comparator illustrated in FIG. 3 is realized in the block KOMP. Further functional blocks RES, Gating and RSFF complete the comparator for use in a communications system with a high clock rate. The additional functional blocks can also be embodied differently in a case-specific manner.

The functional block RES comprises a series of reset transistors 8, which can also be omitted at slower clock frequencies, and enables a defined resetting of the nodes RMi, RPi. As a result of this, any memory of the previous history is erased within the circuit, so that the settling of the nodes RPi, RMi during the amplification phase can also be incomplete without immediately leading to severe signal corruptions due to remnants of the preceding regeneration operation.

The functional block Gating serves to bring the signals at the nodes RPi, RMi to the full logic level for a downstream storage element RSFF and allows the selection of the respectively suitable point in time for the connection of these signals to the downstream RS flip-flop 14.

As can be discerned, the functional block Gating comprises a plurality of transistors 11, to whose control input the output signals RMi, RPi of the regeneration stages 4 are passed. Finally, the signals intended for the RS flip-flop connected downstream are generated, with a sufficiently large signal level, at the nodes Si, Ri. In order to ensure that a low level at the nodes Si, Ri is not influenced by disturbances, a stabilization circuit 9 having a plurality of transistors is provided, which can dissipate the disturbances to ground. For this purpose, a potential is set at the gate terminal VGN2, so that the transistors of the stabilization circuit 9 can draw from the nodes Si, Ri a current which is smaller than that from current from the switched-on transistors 11 and is small enough to prevent fluctuations at the nodes Si, Ri.

Figure 6:
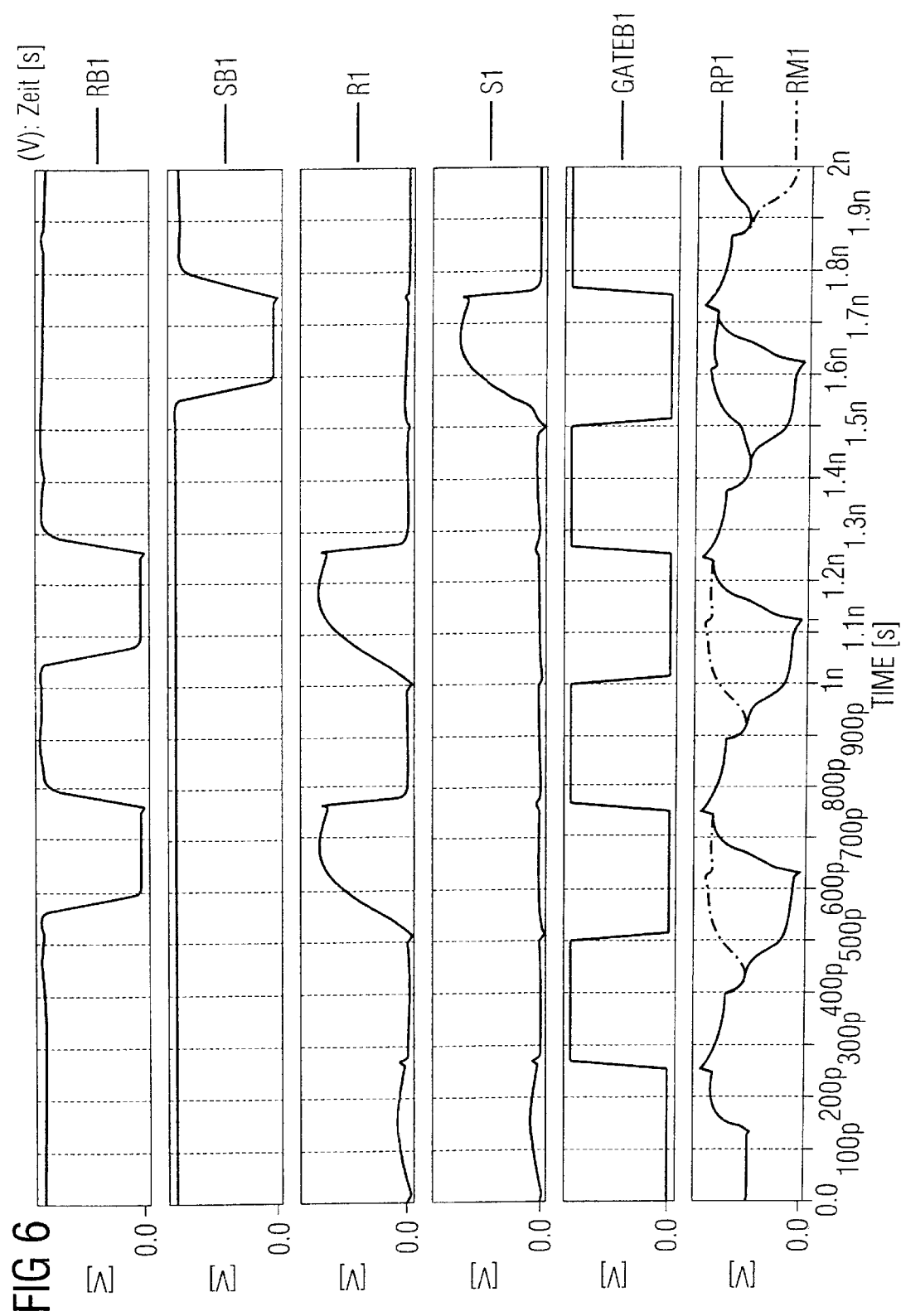
FIG. 6 shows signal profiles at various nodes of the comparator of FIG. 4.
Figure 7:
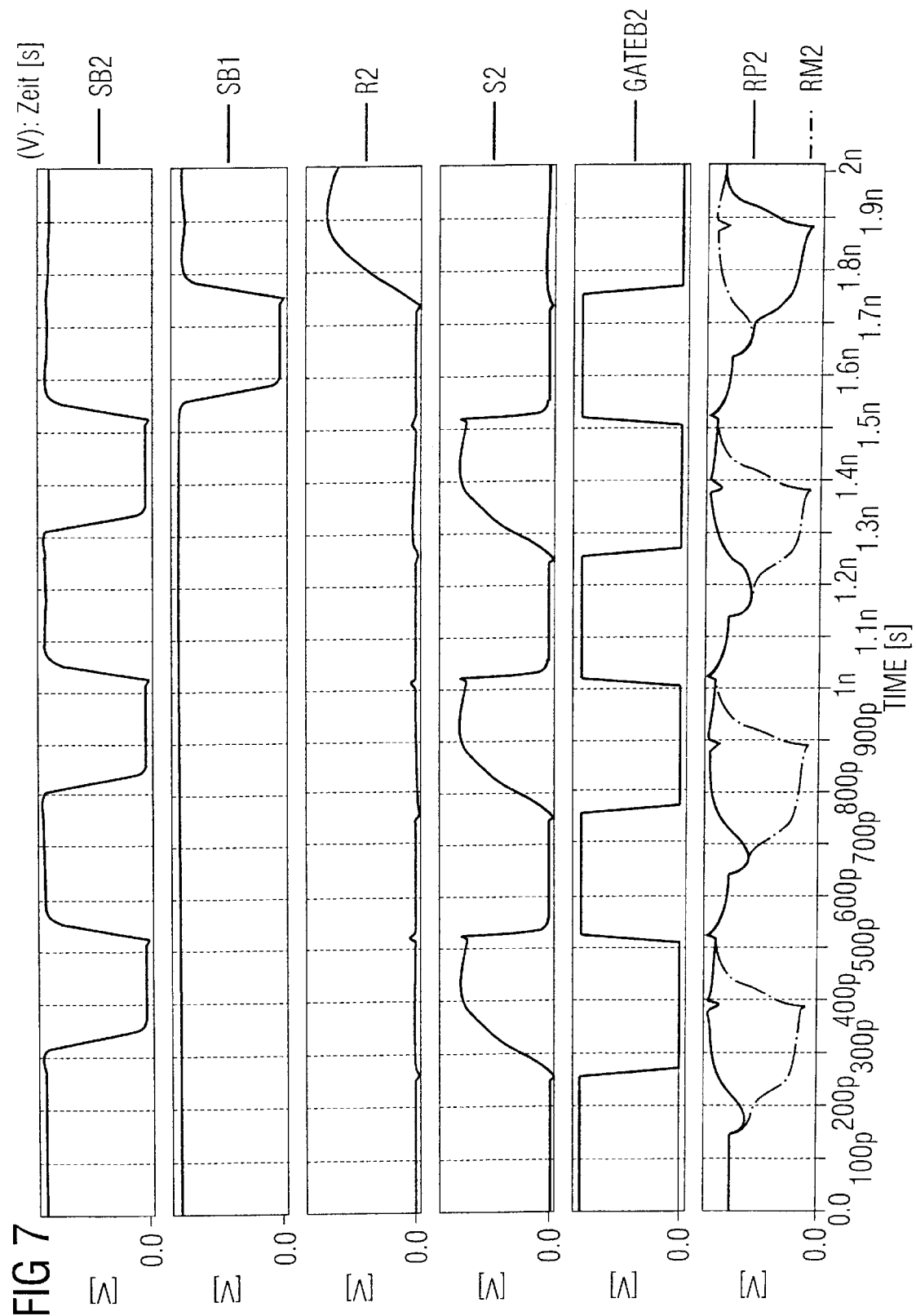
FIG. 7 shows signal profiles at various nodes of the comparator of FIG. 4.

FIGS. 6 and 7 in each case illustrate the relevant signals separately for one half of the overall circuit.

Figure 8:
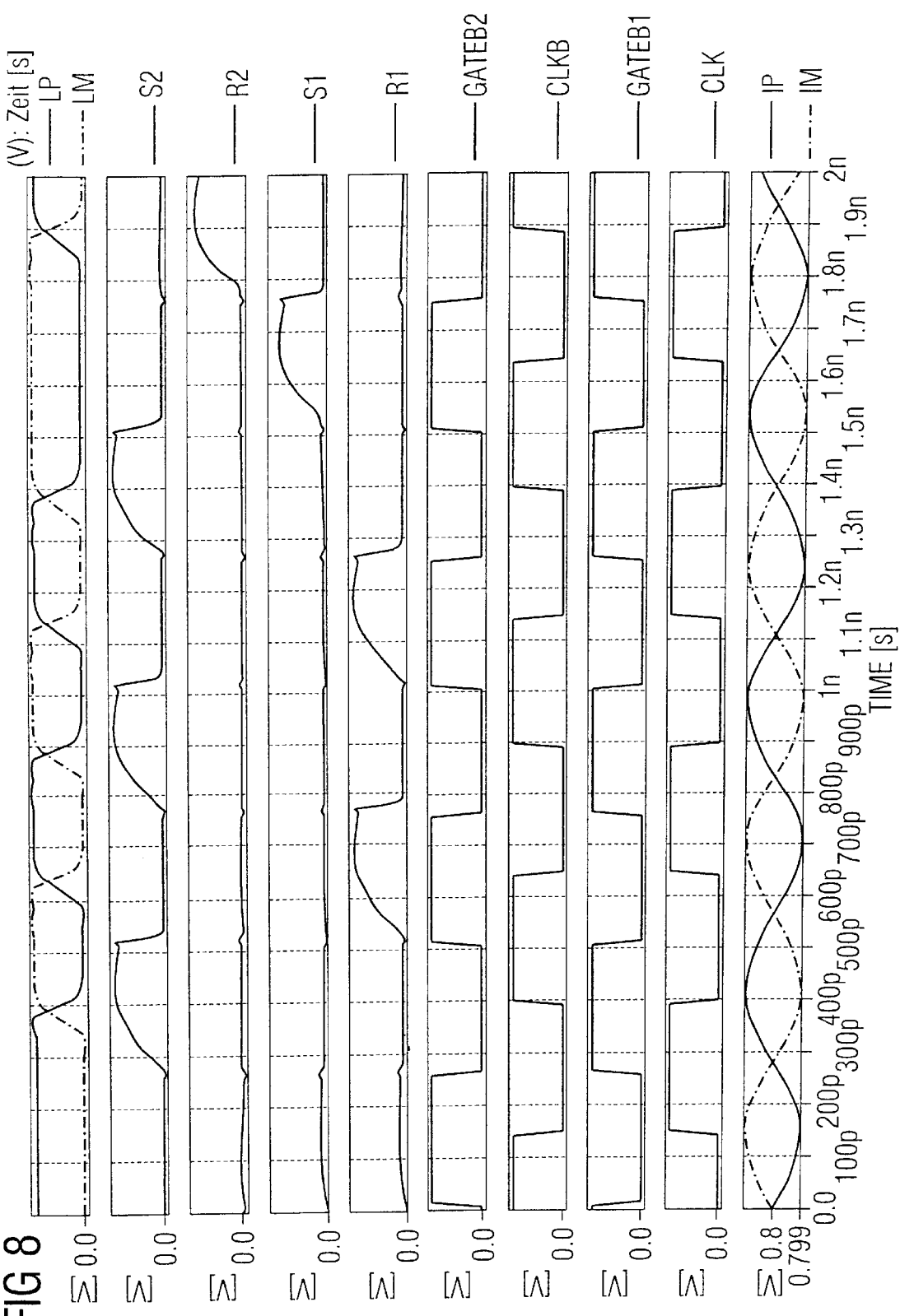
FIG. 8 shows signal profiles at various nodes of the comparator of FIG. 4.

FIG. 8 shows how the final output signal LP, LM of the comparator is composed, and also shows that the signals CLK, GateB1, CLKB, GateB2 are a four-phase clock of significantly lower frequency than the effective comparison rate. Such four-clock phases may originate, for example, from the ring oscillator of a PLL.

Figure 9:
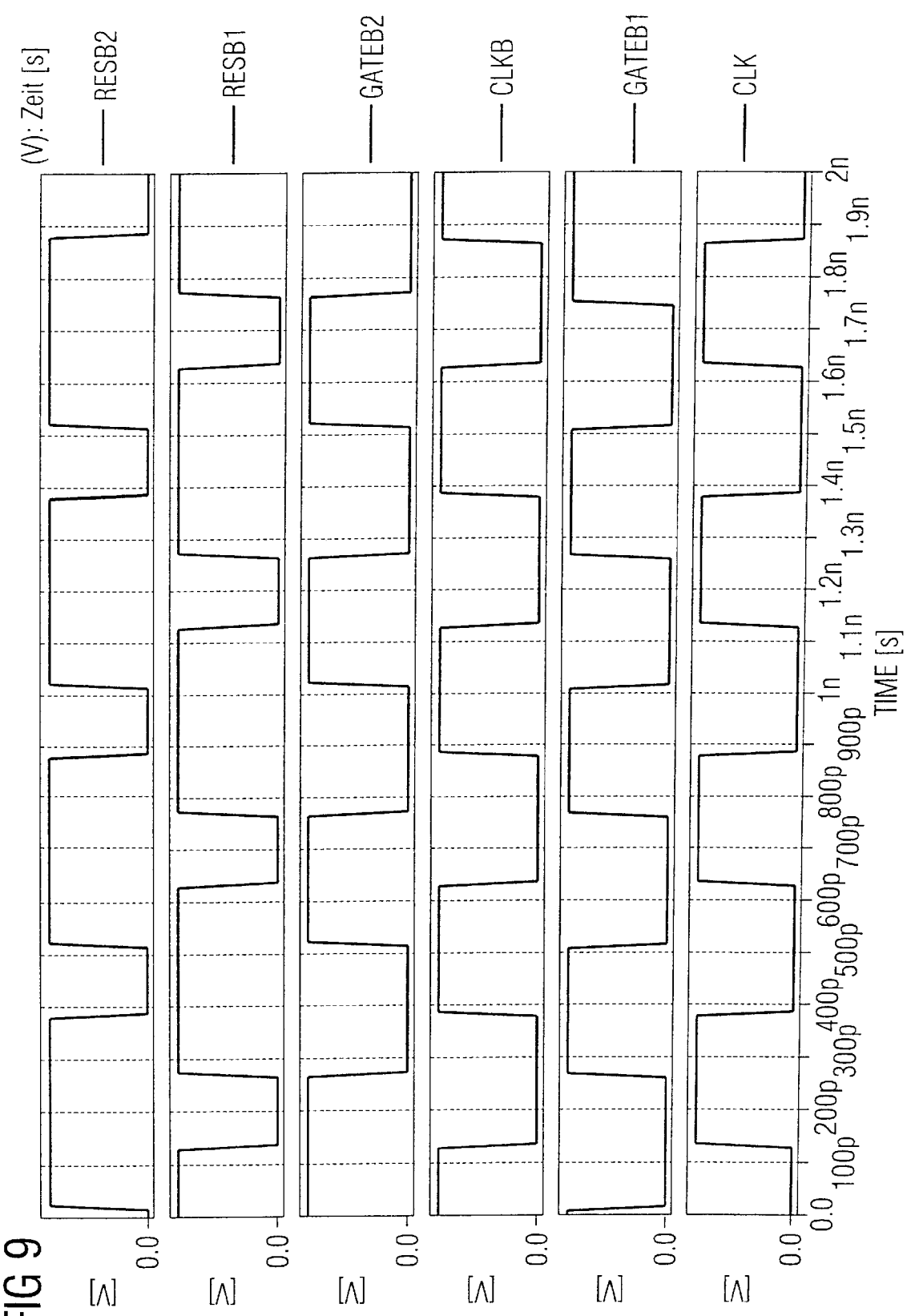
FIG. 9 shows an overview of the entire clock system including the reset signals.

Finally, FIG. 9 shows an overview of the entire clock system including the reset signals. The latter can be derived from the four-phase clock in each case by combinational linkage of suitable signals; if appropriate, the reset transistors 8 in the block RES can also be replaced in each case by two series-connected transistors which are connected to the corresponding signals from the four-phase clock.

In the exemplary embodiment of FIG. 4, the signals originating from the regeneration stages 4A, 4B are combined by means of an individual RS flip-flop to form a signal with an effective comparison rate. At higher clock speeds, it may be more advantageous to pass only a subset of the signals via a gating circuit in each case to one of a plurality of RS flip-flops, and to carry out the further signal processing in a parallel manner.

In the case of very stringent requirements made of the clock speed, a dedicated RS flip-flop 14 should be provided for the output signals RMi, RPi of each regeneration stage 4A, 4B.

Finally, it shall also be mentioned that a complementary comparator circuit can be realized by interchanging the supply voltages VDD, VSS and the polarity of the transistors.

What is claimed is:

1. A multiphase comparator circuit comprising:
   a first differential stage for receiving signal inputs;
   a first switching arrangement for connecting an output of the first differential stage to an input of a load circuit selected from a plurality of load circuits;
   at least two regeneration stages, each of which is connected to a load circuit selected from the plurality of load circuits and to the first switching arrangement;
   a clock-controlled second switching arrangement connected to selectively provide an operating current to the at least two regeneration stages;
   the first and second switching arrangements having switches that are driven so as to operate the at least two regeneration stages in a manner temporally offset from each other.

2. The multiphase comparator circuit of claim 1, wherein the second switching arrangement comprises a plurality of transistors configured to operate as clock-controlled switches.

3. The multiphase comparator circuit of claim 1, wherein the first and second switching arrangements are controlled by corresponding first and second states of a single clock signal.

4. The multiphase comparator circuit of claim 2, wherein the transistors comprise MOS transistors.

5. The multiphase comparator circuit of claim 1, wherein the first and second switching arrangements are controlled by at least two non-overlapping clock phases, such that the output of the first differential stage connects exclusively to a particular load circuit selected from the plurality of load circuits.

6. The multiphase comparator circuit of claim 1, wherein the first and second switching arrangements are controlled by at least two overlapping clock phases, such that the output of the first differential stage is connectable simultaneously to at least two load circuits selected from the plurality of load circuits.

7. The multiphase comparator circuit of claim 1, further comprising:
   a common storage cell having an output at which a comparison result is available at a rate corresponding to the effective comparison rate; and
   a gating circuit configured to pass output signals of the at least two regeneration stages to the common storage cell.

8. The multiphase comparator circuit of claim 1, further comprising:
   a plurality of storage cells, each having an output at which a comparison rate is available at a rate corresponding to a fraction of the effective comparison rate; and
   a gating circuit configured to pass output signals of the at least two regeneration stages to the plurality of storage cells.

9. The multiphase comparator circuit of claim 7, wherein the gating circuit further comprises a stabilization circuit for stabilizing a level of a signal provided to the common storage cell.

10. The multiphase comparator circuit of claim 8, wherein the gating circuit further comprises a stabilization circuit for stabilizing a level of the output signal provided to the plurality of storage cells.

11. The multiphase comparator circuit of claim 7, wherein the output of a regenerative stage is connected to a control input of a transistor of the gating circuit.

12. The multiphase comparator circuit of claim 8, wherein the output of a regenerative stage is connected to a control input of a transistor of the gating circuit.

* * * * *